(12) United States Patent
Weekamp

(10) Patent No.: US 8,138,596 B2
(45) Date of Patent: Mar. 20, 2012

(54) METHOD FOR MANUFACTURING AN ELEMENT HAVING ELECTRICALLY CONDUCTIVE MEMBERS FOR APPLICATION IN A MICROELECTRONIC PACKAGE

(75) Inventor: Johannes W. Weekamp, Beek en Donk (NL)

(73) Assignee: NXP B.V., Eindhoven (NL)

( * ) Notice: Subject to any disclaimer, the term of this patent is extended or adjusted under 35 U.S.C. 154(b) by 175 days.

(21) Appl. No.: 12/594,600

(22) PCT Filed: Apr. 11, 2008

(86) PCT No.: PCT/IB2008/051391
§ 371 (c)(1),
(2), (4) Date: Oct. 4, 2009

(87) PCT Pub. No.: WO2008/126043
PCT Pub. Date: Oct. 23, 2008

(65) Prior Publication Data
US 2010/0127385 A1    May 27, 2010

(30) Foreign Application Priority Data
Apr. 17, 2007    (EP) .................................... 07106330

(51) Int. Cl.
*H01L 23/48* (2006.01)
(52) U.S. Cl. . 257/693; 257/685; 257/666; 257/E21.599; 257/E21.502; 438/123; 438/124; 438/125; 438/113
(58) Field of Classification Search .................. 257/693, 257/685, 666, E21.599, E21.502, E23.01; 438/123–125, 113
See application file for complete search history.

(56) References Cited

U.S. PATENT DOCUMENTS

| | | | | |
|---|---|---|---|---|
| 3,571,647 A | * | 3/1971 | Robinson | 313/509 |
| 4,113,981 A | * | 9/1978 | Fujita et al. | 174/88 R |
| 4,356,529 A | * | 10/1982 | Kopel | 361/304 |
| 4,845,452 A | * | 7/1989 | Sasaki et al. | 336/200 |
| 5,216,807 A | * | 6/1993 | Yoshizawa et al. | 29/876 |
| 5,218,168 A | | 6/1993 | Mitchell et al. | |
| 5,469,020 A | * | 11/1995 | Herrick | 313/511 |
| 5,485,355 A | * | 1/1996 | Voskoboinik et al. | 362/84 |
| 5,637,176 A | * | 6/1997 | Gilleo et al. | 156/277 |
| 5,774,028 A | * | 6/1998 | Kim | 333/181 |
| 5,857,858 A | * | 1/1999 | Gorowitz et al. | 439/86 |

(Continued)

FOREIGN PATENT DOCUMENTS

DE    10249854 A1    5/2004

(Continued)

*Primary Examiner* — Fernando L Toledo
*Assistant Examiner* — Ankush Singal

(57) ABSTRACT

A microelectronic package (31) has a microelectronic device, which is encapsulated in a quantity of material (27), and a lead frame element (15) for enabling the microelectronic device to be electrically contacted from outside of the package (31). The lead frame element (15) comprises at least two elongated members (11) comprising electrically conductive material and a filling material (12) comprising electrically insulating material, wherein the members (11) are partially embedded in the filling material (12). The lead frame element (15) is manufactured by providing elongated members (11), positioning the members (11) according to a predetermined configuration, providing filling material (12) to spaces (13) which are present between the members (11), and possibly removing portions of the filling material (12) and the members (11) in order to expose the electrically conductive material of the members (11). An important advantage of manufacturing the lead frame element (15) on the basis of elongated members (11) and a filling material (12) is that no waste or only a small quantity of waste is produced.

13 Claims, 8 Drawing Sheets

U.S. PATENT DOCUMENTS

| | | | | |
|---|---|---|---|---|
| 5,864,173 A * | 1/1999 | Fogelson | | 257/666 |
| 5,920,116 A * | 7/1999 | Umehara et al. | | 257/669 |
| 5,962,967 A * | 10/1999 | Kiryuschev et al. | | 313/491 |
| 6,189,202 B1 * | 2/2001 | Masuda et al. | | 29/605 |
| 6,307,272 B1 * | 10/2001 | Takahashi et al. | | 257/787 |
| 6,429,045 B1 * | 8/2002 | Furukawa et al. | | 438/107 |
| 6,433,995 B2 * | 8/2002 | Nakagawa et al. | | 361/311 |
| 6,445,593 B1 * | 9/2002 | Okuyama | | 361/765 |
| 6,463,317 B1 * | 10/2002 | Kucharczyk et al. | | 600/411 |
| 6,525,405 B1 * | 2/2003 | Chun et al. | | 257/666 |
| 6,570,339 B1 * | 5/2003 | Moore | | 315/169.3 |
| 6,624,565 B2 * | 9/2003 | Topelberg | | 313/495 |
| 6,697,191 B2 * | 2/2004 | Kiryuschev et al. | | 359/345 |
| 6,732,913 B2 * | 5/2004 | Alvarez | | 228/246 |
| 6,790,705 B2 * | 9/2004 | Oka et al. | | 438/113 |
| 6,831,372 B2 * | 12/2004 | Ruhland | | 257/783 |
| 6,858,461 B2 * | 2/2005 | Oswald et al. | | 438/68 |
| 6,861,736 B2 * | 3/2005 | Lee et al. | | 257/676 |
| 6,917,098 B1 * | 7/2005 | Yamunan | | 257/666 |
| 7,172,924 B2 * | 2/2007 | Hasegawa | | 438/106 |
| 7,235,804 B2 * | 6/2007 | Aki | | 250/551 |
| 7,303,994 B2 * | 12/2007 | Cooney et al. | | 438/694 |
| 7,439,612 B2 * | 10/2008 | Matsunami | | 257/676 |
| 7,542,017 B2 * | 6/2009 | Hioki et al. | | 345/76 |
| 7,671,474 B2 * | 3/2010 | Dirks | | 257/760 |
| 2001/0015490 A1 * | 8/2001 | Lee | | 257/693 |
| 2003/0006693 A1 * | 1/2003 | Topelberg | | 313/483 |
| 2003/0015775 A1 * | 1/2003 | Minamio et al. | | 257/676 |
| 2004/0187917 A1 * | 9/2004 | Pichler | | 136/263 |
| 2005/0046020 A1 | 3/2005 | Andou | | |
| 2005/0098859 A1 * | 5/2005 | Hasegawa | | 257/666 |
| 2006/0133044 A1 * | 6/2006 | Kim et al. | | 361/704 |
| 2007/0040237 A1 * | 2/2007 | Coyle et al. | | 257/531 |
| 2007/0246250 A1 * | 10/2007 | Tomita et al. | | 174/258 |
| 2008/0145568 A1 * | 6/2008 | Lee et al. | | 427/595 |
| 2009/0166657 A1 * | 7/2009 | Yamada et al. | | 257/98 |

FOREIGN PATENT DOCUMENTS

| | | |
|---|---|---|
| EP | 0875936 A | 11/1998 |
| FR | 2485960 A1 | 1/1982 |
| GB | 1305174 A | 1/1973 |
| JP | 4-64414 A | 3/1992 |
| WO | 2007005263 A | 1/2007 |

\* cited by examiner

METHOD FOR MANUFACTURING AN ELEMENT HAVING ELECTRICALLY CONDUCTIVE MEMBERS FOR APPLICATION IN A MICROELECTRONIC PACKAGE

FIELD OF THE INVENTION

The present invention relates to a method for manufacturing an element which is intended to be applied in a microelectronic package having at least one microelectronic device, for the purpose of enabling the microelectronic device to be electrically contacted from outside of the package.

The present invention also relates to a method for manufacturing a foil which is intended to be applied in a process of manufacturing an array of elements, wherein each element is intended to be applied in a microelectronic package having at least one microelectronic device, for the purpose of enabling the microelectronic device to be electrically contacted from outside of the package. Furthermore, the present invention relates to a method for manufacturing a microelectronic package, and to a microelectronic package.

BACKGROUND OF THE INVENTION

Microelectronic packages in which at least one microelectronic device is arranged are well-known, and various types of such packages have been developed. Among other things, the packages serve for protecting the microelectronic device and allowing for easy electrical connection of the microelectronic device to another device. In general, dimensions of the packages are in the millimeter range. Examples of microelectronic devices are a processor chip, a MEMS microphone, wherein MEMS stands for Micro ElectroMechanical System, a transistor, a sensor die, a diod, a Light Emitting Diode (LED), etc.

In general, for the purpose of supporting the microelectronic device and for ensuring that the microelectronic package has a required robustness, a carrier substrate is provided, wherein the microelectronic device is attached to the substrate. In a usual embodiment of the microelectronic package, a side of the carrier substrate where the microelectronic device is present is covered with material, wherein the microelectronic device is encapsulated in this material, whereas another side of the carrier substrate is freely accessible.

The carrier substrate is provided with electrically conductive tracks extending from the one side of the substrate to the other side of the substrate, in order to allow for electric contact from outside of the package to the microelectronic device. It is possible to have the electrically conductive tracks when a printed circuit board is provided, but in many cases, a metal lead frame, for example a copper lead frame, is provided for realizing these tracks. Such a lead frame is manufactured by providing a metal sheet, removing portions from this sheet and possibly bending this sheet in order to obtain a desired appearance of the lead frame. In practical cases, approximately ten times the sheet surface needed for forming the lead frame is thrown away when the lead frame is manufactured in this way.

SUMMARY OF THE INVENTION

It is an objective of the present invention to provide a method for manufacturing an element which is intended to be applied in a microelectronic package having at least one microelectronic device, for the purpose of enabling the microelectronic device to be electrically contacted from outside of the package, which is different from the above-described method for manufacturing a metal lead frame, in such an advantageous way that less waste is produced and lower costs are involved. This objective is achieved by a method which comprises the following steps:

providing at least two members comprising electrically conductive material and having an elongated appearance;

placing the elongated members in predetermined positions with respect to each other; and providing a non-conductive filling material for embedding at least a portion of the elongated members and fixing the elongated members in their predetermined positions with respect to each other.

When the method according to the present invention is applied, manufacturing an element which is intended to function as a lead frame in a microelectronic package involves providing elongated members comprising electrically conductive material, and providing a non-conductive filling material. In the process, the elongated members are at least partially embedded in the filling material, as a result of which the elongated members get fixed with respect to each other. In this context, getting at least partially embedded means getting surrounded by a mass, over a portion or completely, and getting fixed in that mass.

The elongated members may be wires or narrow strips, for example, whether comprising an electrically insulating outer layer, or not, wherein a cross-section of the elongated members may have any suitable shape, and may for example be circular. It is also possible that the elongated members are hollow wires, which is particularly advantageous in case the element according to the present invention also needs to be capable of performing a cooling function. Cooling may be necessary during operation of a high power LED, for example, and may be effectively performed by using a cooling fluid which is conveyed through the hollow wires. In the following, for sake of clarity, the element according to the present invention will be referred to as lead frame element.

When the method according to the present invention is applied, the lead frame element is produced with significantly less waste than when the method according to the state of the art is applied. According to the state of the art, manufacturing a lead frame involves removing portions of a sheet of material, whereas according to the present invention, only the necessary portions are provided, wherein there is no need or hardly any need for removal of material. Costs are dramatically reduced, as the filling material may be relatively cheap. For example, copper wires and an epoxy filling material may be applied, which is much cheaper than applying a copper sheet.

The elongated members may be provided as separate members, but may also be part of a larger member of which at least one portion is removed at a later stage. For example, the elongated members may initially be part of a U-shaped member, wherein a curved bottom portion of the U-shaped member is cut away once the filling material has been provided, or the elongated members may initially be part of a coil-shaped member, wherein the coil-shaped member is cut open in a longitudinal direction once the filling material has been provided and windings of the coil-shaped member are fixed as a result thereof. In general, the elongated members may be interconnected in a first instance, wherein the elongated members are separated after the step of providing the filling material has been carried out.

In practice, the step of providing a filling material may involve supplying material in a fluid state to a space which is present between the elongated members, and allowing the material to solidify. In some cases, it may be desirable to remove a portion of the filling material when it is in a solid state, in order to expose a portion of the elongated members, so that it is possible for these members to be contacted. For example, the lead frame element may be subjected to a cutting action, wherein a layer of the lead frame element is removed by cutting through the filling material and the elongated members, wherein a portion of the elongated members extending in a longitudinal direction of the elongated members is removed. In this way, it is achieved that the elongated members are not fully encapsulated in the filling material, so that it is possible for the elongated members to be contacted. Especially when the elongated members comprise an outer layer of electrically insulating material, it is advantageous to cut through the elongated members, as in that way, the electrically conductive material of the elongated members may be exposed.

Advantageously, means are used for temporarily supporting the elongated members and ensuring that the elongated members maintain their predetermined positions with respect to each other when the filling material is provided. By using supporting means, handling and positioning of the elongated members may be facilitated, wherein it is very well possible to keep the elongated members in a desired configuration.

Depending on the design of the microelectronic package of which the lead frame element is intended to be part, the elongated members may be positioned such as to be extending substantially parallel, but it is also possible for the elongated members to be positioned at different levels, in a crossed configuration.

The method according to the present invention may comprise a step of interrupting at least one of the elongated members by cutting away a portion of the elongated member, after the step of providing the filling material has been carried out. In this way, it is possible to obtain relatively short portions of the elongated members, which may serve for carrying a solder bump. The solder bumps may be applied to the relatively short portions of the elongated members in any suitable way. For example, the relatively short portions may be dipped in a quantity of molten solder, wherein droplets of solder stay behind on the relatively short portions of the elongated members. The solder bumps allow for easy electrical connection of the lead frame element to a device outside of the microelectronic package of which the lead frame element is intended to be part, for example a printed circuit board.

The present invention further relates to a method for manufacturing a foil which is intended to be applied in a process of manufacturing an array of lead frame elements. Such a foil is especially suitable to be applied in a process of mass production of microelectronic packages. The present invention proposes to manufacture the foil by performing the following steps:
    providing at least one member comprising electrically conductive material and having an elongated appearance;
    providing a winding reel and winding the elongated member around the reel;
    providing a non-conductive filling material to the reel having the elongated member wound thereon.

The elongated member may be a wire which is wound off of a reel, wherein the wire is wound on the winding reel in order to form a coil having spaced apart windings. When the filling material has been provided, the foil is obtained by cutting open the thus obtained hollow cylinder of wire and filling material in a longitudinal direction of the cylinder. This method is very suitable to be used in mass production of microelectronic packages. In order to speed up the formation of the foil, which is relevant in a context of mass production, it is preferred if at least two reels having wire wound thereon are supplied, wherein the wires of the various reels are positioned next to each other in the process of being wound on the winding reel for forming the foil.

The present invention further relates to a method for manufacturing a microelectronic package. In general, this method comprises the following steps:
    providing an element having at least two elongated members comprising electrically conductive material, which are at least partially embedded in a non-conductive filling material;
    providing a microelectronic device and establishing electrical connections between this device and at least two elongated members of the element; and
    providing material for encapsulating the microelectronic device.

In the process, methods such as wirebonding for establishing the electrical connections between the microelectronic device and the elongated members of the element, and overmoulding for encapsulating the microelectronic device, which are known per se in the field of manufacturing microelectronic packages, may be applied.

According to the present invention, a method for manufacturing a microelectronic package which is suitable to be applied for the purpose of mass production of microelectronic packages comprises the following steps:
    manufacturing an array of microelectronic packages by providing an array of elements, wherein each element has at least two elongated members comprising electrically conductive material, which are at least partially embedded in a non-conductive filling material; providing microelectronic devices and establishing electrical connections between these devices and at least two elongated members of the elements; and providing material for encapsulating the microelectronic devices; and
    dividing the array of microelectronic packages into individual microelectronic packages.

Preferably, the step of providing an array of elements, wherein each element has at least two elongated members comprising electrically conductive material, is performed by providing the foil as described in the foregoing. In that case, the foil may be folded for the purpose of obtaining a crossed configuration of elongated members. In a case in which the foil comprises elongated members which are extending substantially parallel with respect to each other, a crossed configuration of the elongated members, wherein the elongated members are extending at different levels, may be obtained by folding the foil along a folding line extending at an angle which deviates from an angle of 90° with respect to a longitudinal direction of the wires. In case there is a risk of electric contact between wires of different levels of the foil, it is advantageous if a layer of electrically insulating material is arranged between the folded portions of the foil. Folding of the foil may also be performed for the purpose of creating contact spots at predetermined locations of an outer surface of a microelectronic package.

The above-described and other aspects of the present invention will be apparent from and elucidated with reference to the following description of a method for manufacturing an array of lead frame elements according to the present invention, a number of embodiments of a microelectronic package having a lead frame element according to the present invention, and the way in which the microelectronic packages are manufactured.

BRIEF DESCRIPTION OF THE DRAWINGS

The present invention will now be explained in greater detail with reference to the Figures, in which equal or similar parts are indicated by the same reference signs, and in which.

DETAILED DESCRIPTION OF EMBODIMENTS

Figure 1:
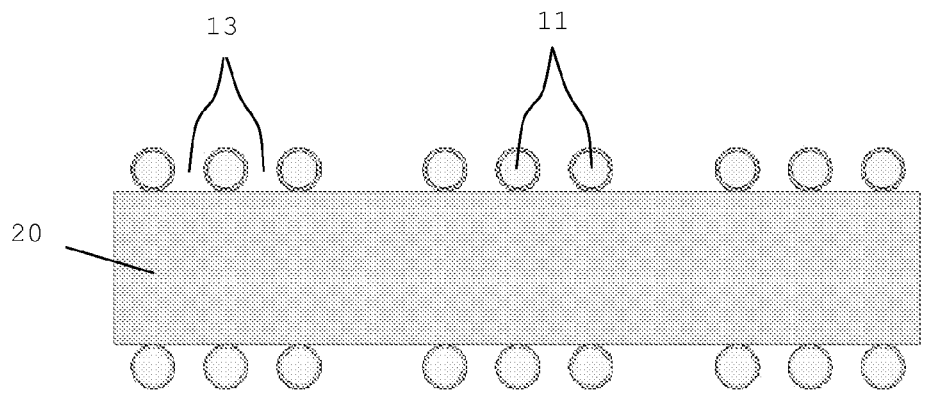
FIGS. 1-3 illustrate successive steps of a process of manufacturing a foil having electrically conductive wires, which is intended to be used in a process of manufacturing an array of microelectronic packages having a lead frame element according to the present invention.
Figure 2:
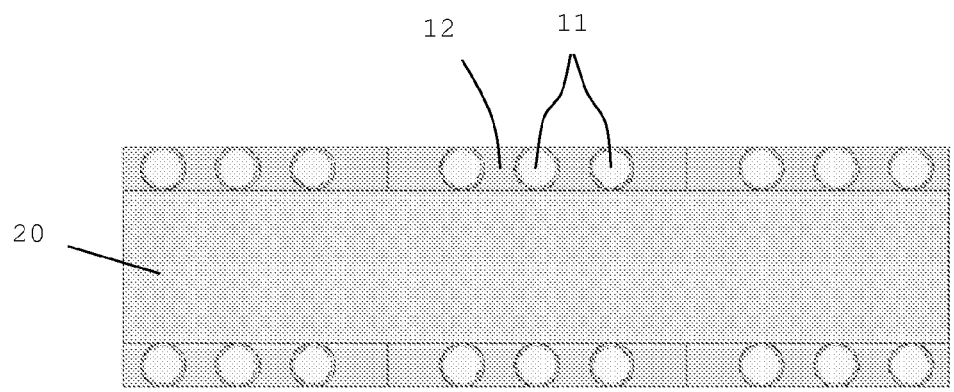
Figure 3:
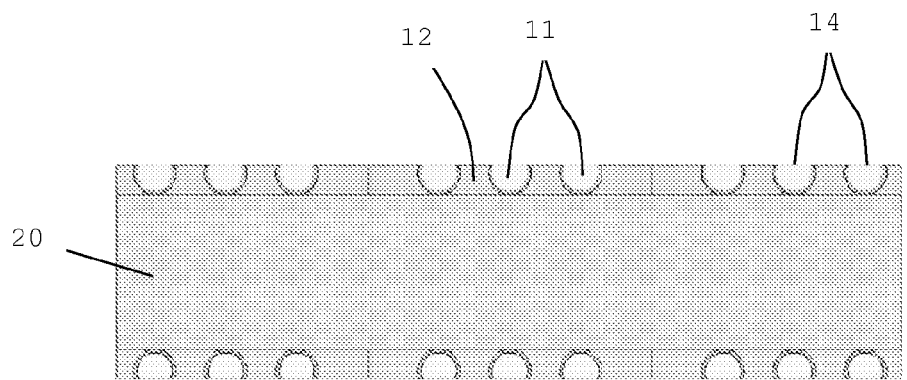
Figure 4:
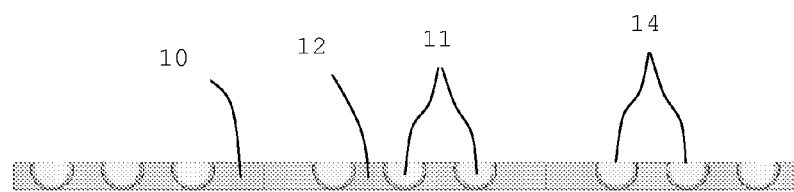
FIG. 4 shows a side view of a cross-section of the foil which is obtained by performing the manufacturing process illustrated in FIGS. 1-3.

FIGS. 1-3 illustrate successive steps of a process of manufacturing a foil 10 having electrically conductive wires 11, which is shown in FIG. 4. The foil 10 is intended to be used in a process of manufacturing an array of microelectronic packages having a lead frame element according to the present invention, in particular a lead frame element comprising at least two electrically conductive wires 11, partially embedded in filling material 12.

In a first step in the manufacturing process of the foil 10, which is illustrated in FIG. 1, a cylinder-shaped drum 20 is provided, and electrically conductive wires 11 are wound around the drum 20. The wires 11 may be metal wires, and the wires 11 may comprise an electrically insulating outer layer, but this is not necessary. In the shown example, the wires 11 are wound off of three reels (not shown). Within the scope of the present invention, the number of reels and wires 11 may be chosen freely. The wires 11 are positioned in such a way that contact between adjacent wires 11 is prevented, wherein spaces 13 are present between the wires 11. For the purpose of keeping the wires 11 in a proper position on the drum 20, a suitable type of adhesive tape (not shown) may be applied, wherein the tape is arranged around the drum 20, such that an adhesive side of the tape is facing outwardly with respect to the drum 20.

In a second step in the manufacturing process of the foil 10, which is illustrated in FIG. 2, filling material 12 is provided. In particular, the filling material 12 is supplied to the spaces 13 between the wires 11. For example, the filling material 12 is supplied to the spaces 13 in a fluid state, and is thereafter allowed to solidify. Application of the filling material 12 may be realized by dipping the mesh of wires 11 in the fluid filling material 12, while rotating the drum 20. Any suitable type of filling material 12 may be used, such as an epoxy filling material or a polyimide filling material.

In a third step in the manufacturing process of the foil 10, which is illustrated in FIG. 3, an outer layer of the assembly of wires 11 and filling material 12 is removed. For example, the outer layer is cut away by means of a chisel. In the process, portions of the wires 11, extending in a longitudinal direction of the wires 11, are removed, so that contacting surfaces 14 of the wires 11 are realized, wherein electrically conductive material of the wires 11 is exposed and contactable.

In a fourth step in the manufacturing process of the foil 10, the foil 10 which is obtained as a result of performing the third step as described in the foregoing is cut through, in a longitudinal direction of the drum 20, and is removed from the drum 20 and straightened. A cross-section of the foil 10 in the straightened condition is shown in FIG. 4. In the foil 10 as shown, the wires 11 are extending substantially parallel with respect to each other.

Figure 5:
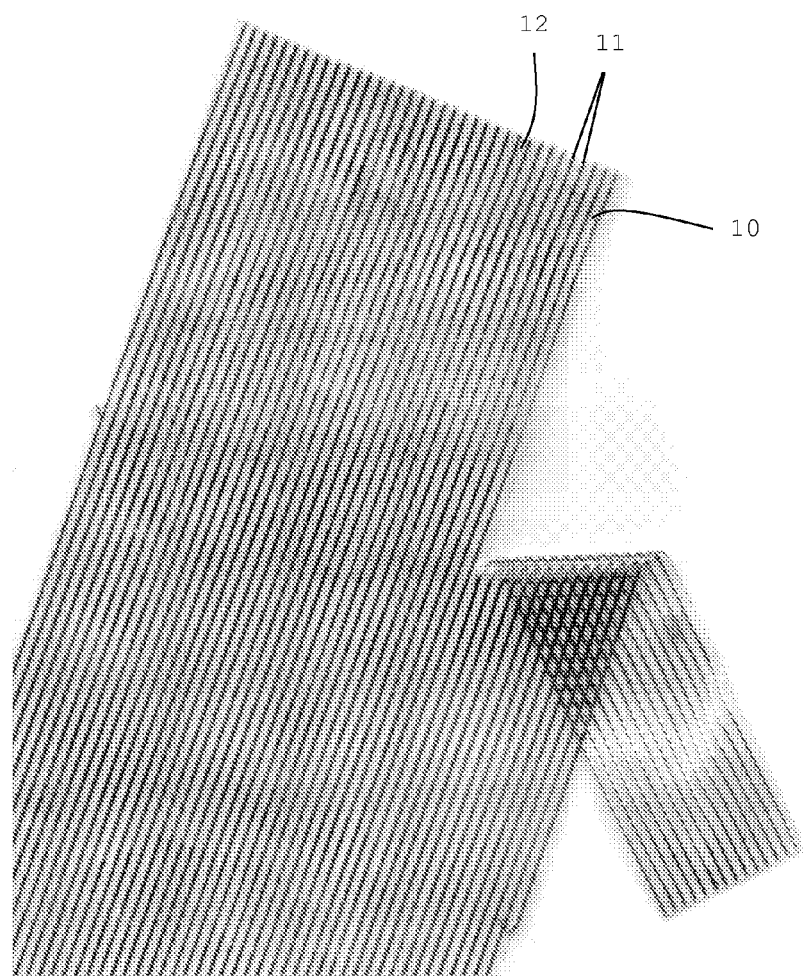
FIG. 5 illustrates a way of further handling of the foil.

FIG. 5 shows a top view of the foil 10, and serves to illustrate a way of further handling of the foil 10. In particular, FIG. 5 illustrates a possibility of splicing the foil 10 and folding back a portion of the foil 10. In that a way, a crossed configuration of the wires 11, wherein the wires 11 are extending at different levels, is obtained. If so desired and/or necessary in order to prevent electric contact between wires 11 of the different levels, a layer of electrically insulating material may be arranged between the folded portions of the foil 10.

It may be desired to have a crossed configuration of the wires 11 and to perform the step of folding the foil 10 for the purpose of realizing such configuration. However, it is also possible to manufacture an array of microelectronic packages on the basis of an non-folded foil 10, as will be now be explained on the basis of FIGS. 6-8.

Figure 6:
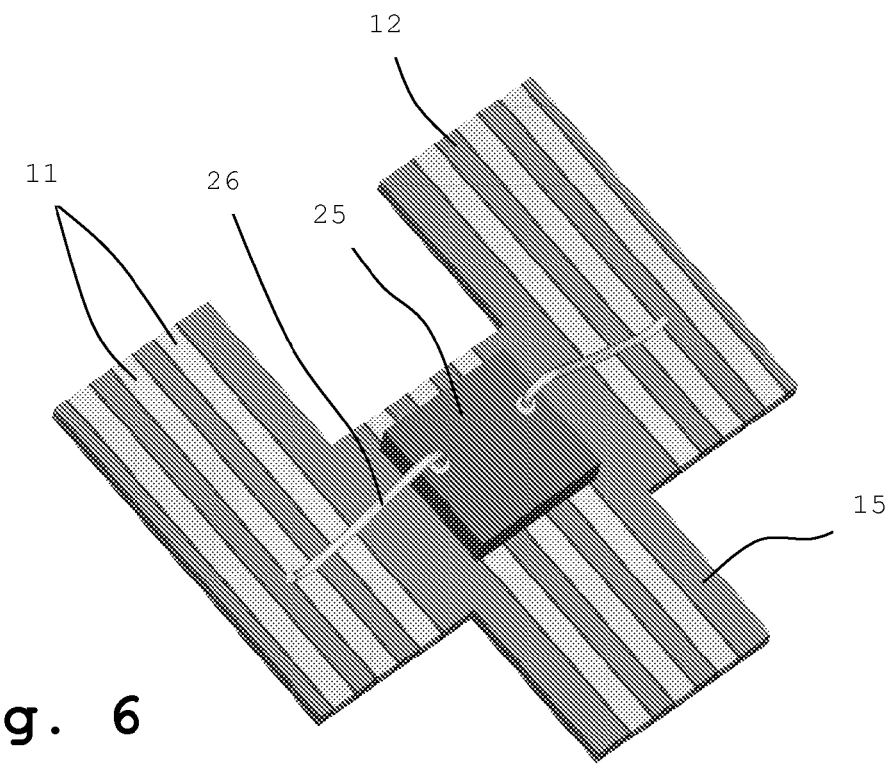
FIGS. 6-8 illustrate steps of a process of manufacturing a microelectronic package on the basis of the foil.

FIG. 6 shows a portion of the foil 10, namely a portion which is intended to be a lead frame element 15 of a single microelectronic package. It is clear that the foil 10 may be regarded as a collection of these lead frame elements 15, and is therefore suitable to be used in a process of manufacturing an array of microelectronic packages. FIG. 6 illustrates a step in this process, namely the step of providing a microelectronic device 25 and attaching this device 25 to some of the wires 11. The microelectronic device 25 may be a processor chip, a MEMS microphone, a transistor, a sensor die, a diod, a LED, etc. Electric contact between the microelectronic device 25 and wires 11 of the lead frame element 15 is established in any suitable way, for example through wirebonding, as illustrated in FIG. 6, which shows wires 26 extending between the microelectronic device 25 and wires 11 of the lead frame element 15.

Figure 7:
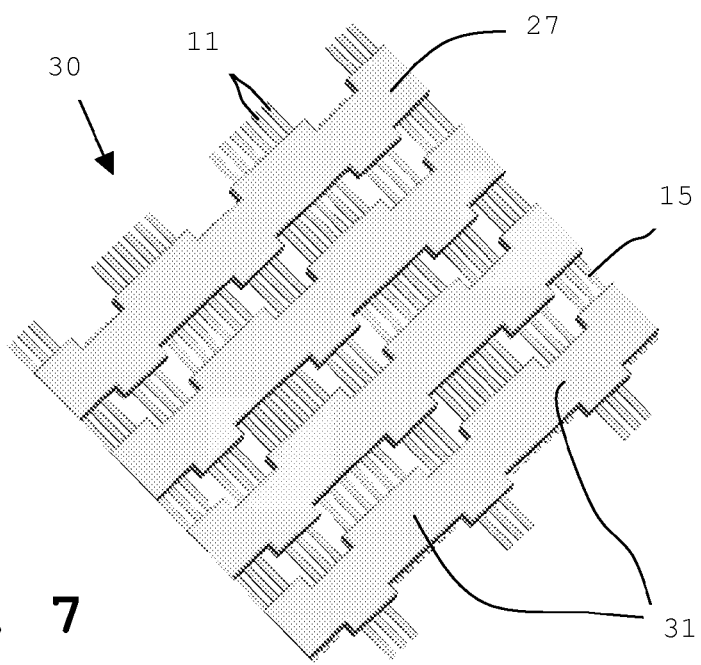

When the microelectronic devices 25 have been put in place on the foil 10, material 27 is applied for encapsulating the microelectronic devices 25. To this end, a technique known as overmoulding may be applied. The material 27 may be transparent, which is especially advantageous in case the microelectronic device 25 is a LED or another light emitting device. In principle, it is possible to cover the whole area of the foil 10 by a suitable material 27, but, as shown in FIG. 7, it is also possible to leave portions of the foil 10 uncovered. In case adhesive tape is applied as supporting means for keeping the wires 11 in proper mutual positions on the drum 20, it may be removed after the overmoulding process has taken place. However, it is also possible that removal of the adhesive tape takes place at an earlier stage.

In the shown example, filling material 12 which is present between wires 11 of the uncovered portions of the foil 10 is removed. This is done by performing a so-called de-flashing process, during which the filling material 12 is removed through powder spraying, or in a chemical way, or through dipping in molten solder. In the latter case, the wires 11 get tin-plated during the de-flashing process, which is an advantageous side effect. The result of the overmoulding process and the de-flashing process, which is an array 30 of microelectronic packages 31, is shown in FIG. 7.

Figure 8:
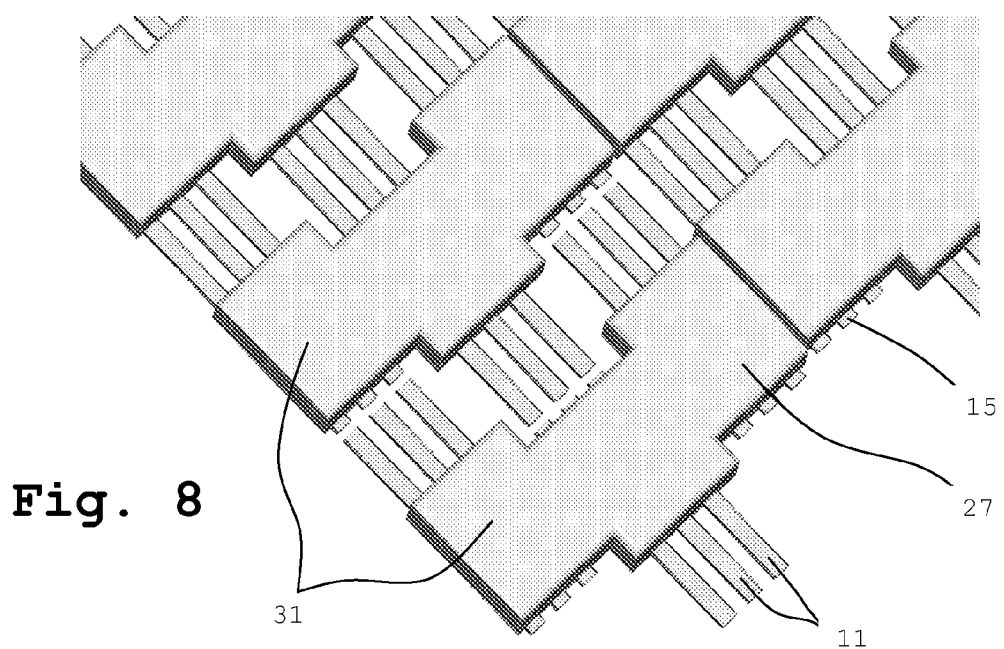
Figure 9:
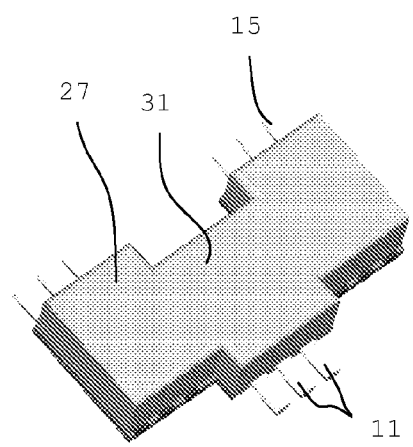
FIGS. 9 and 10 show two different views of the microelectronic package which is obtained as a result of the process illustrated in FIGS. 6-8.
Figure 10:
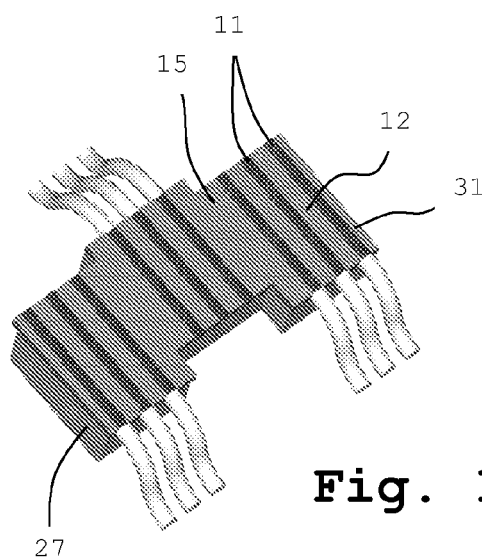

FIG. 8 serves to illustrate a process of separating individual microelectronic packages 31 from the array 30 of packages 31. In the process, both the portions of material 27 encapsulating the microelectronic device 25 and the wires 11 are cut through. The microelectronic package 31 which is thus obtained is shown in FIGS. 9 and 10. In FIG. 10, it is shown that the uncovered portions of the wires 11 may be bent. In that case, the microelectronic package 31 is especially suitable to be connected to a device such as a printed circuit board by a soldering technique which is known as wave soldering, during which the device and the package 31 positioned thereon are passed across a pumped wave or cascade of solder, wherein the solder wets to exposed metallic areas of the device and the package 31, creating a reliable mechanical and electrical connection. Another soldering technique which may be applied for the purpose of connecting the microelectronic package 31 to a device such as a printed circuit board is known as reflow soldering, in which solder paste is used, which is made to reflow under the influence of heat, wherein a strong metallurgical bond is obtained after the solder has solidified.

An important advantage of the above-described way of manufacturing microelectronic packages 31 is that the step of providing the lead frame element 15 does not involve a production of waste of electrically conductive material, which may be copper or another metal. Providing electrically conductive wires 11 and electrically insulating filling material 12 for supporting the wires 11 and keeping the wires 11 in predetermined mutual positions is a cheap alternative to the conventional processes of manufacturing a lead frame, during which a metal sheet is provided and portions of this sheet are removed.

For the purpose of forming a lead frame element 15 of a microelectronic package 31 on the basis of wires 11, it is very advantageous to manufacture the above-described foil 10 having partially exposed electrically conductive wires 11. It is noted that it is not necessary to use a drum 20 in the process of manufacturing the foil 10. For example, it is also possible to provide a number of wires 11, to put these wires 11 in a parallel position with respect to each other, and to provide the filling material 12. In such a case, the foil 10 is straightened from the start. Furthermore, the microelectronic package may have any suitable design. For example, the microelectronic package may comprise two or more microelectronic devices 25.

Figure 11:
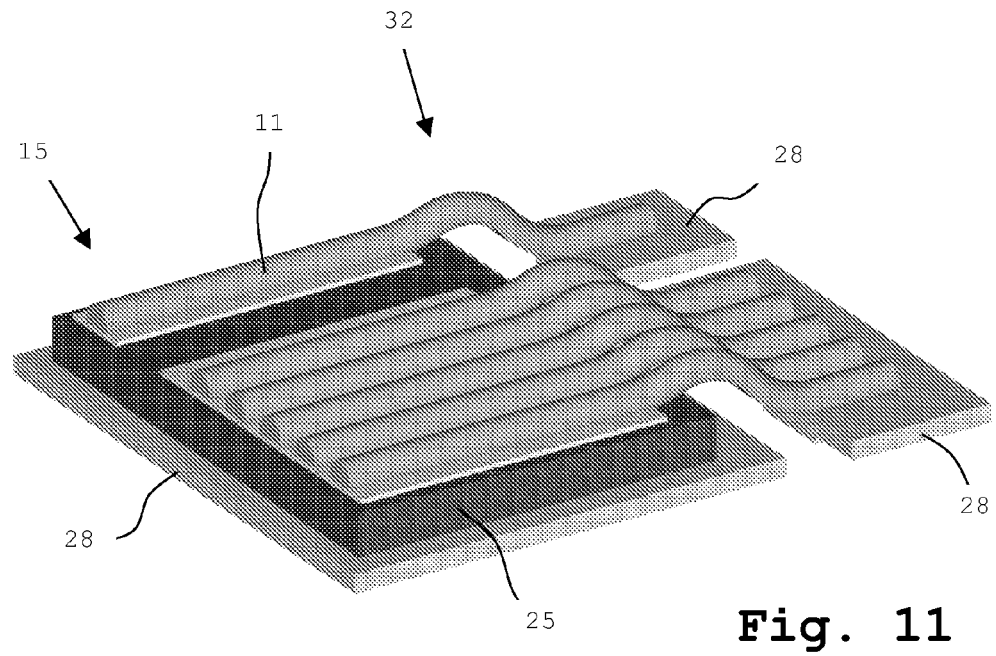
FIG. 11 shows a first alternative embodiment of a microelectronic package comprising a lead frame element according to the present invention.
Figure 18:
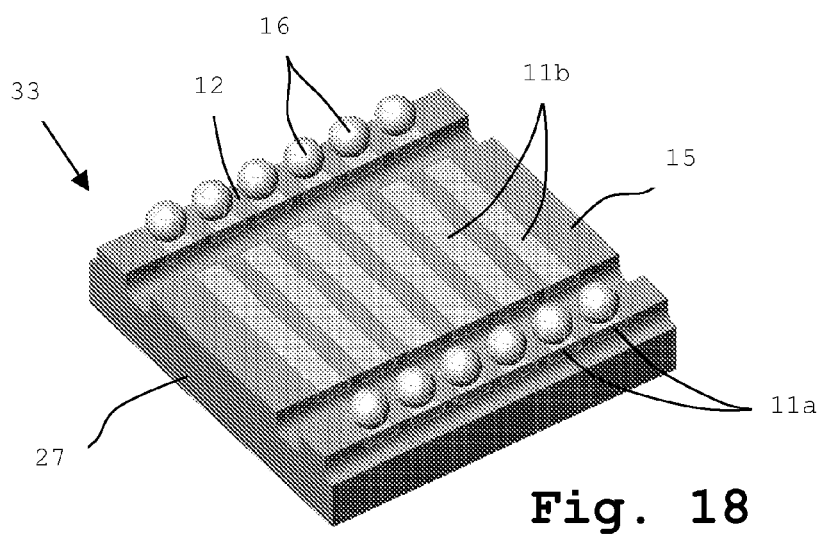
Figure 19:
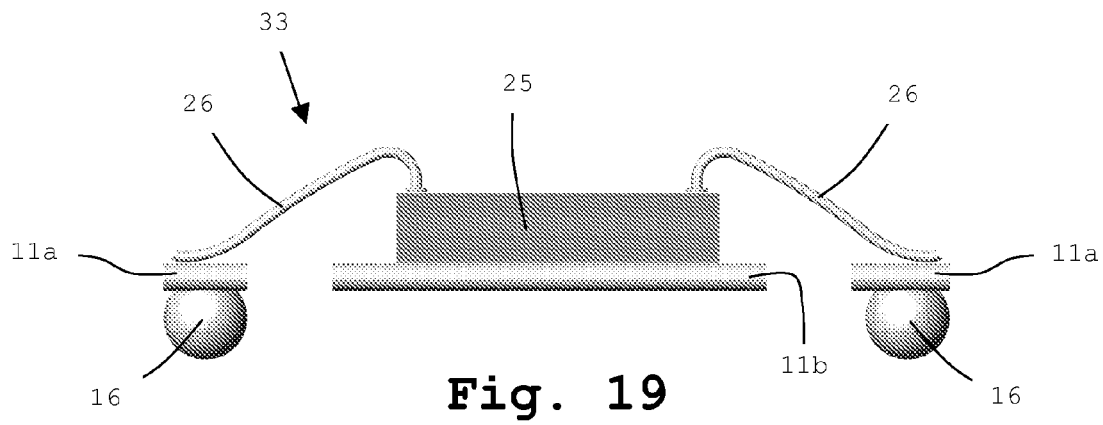
FIG. 19 shows a side view of a cross-section of the second alternative embodiment of the microelectronic package according to the present invention.

Examples of alternative microelectronic packages are illustrated in FIGS. 11, 18 and 19.

In FIG. 11, a first alternative microelectronic package 32 is shown, wherein, for sake of clarity, the filling material 12 which is present between the wires 11 of the lead frame element 15 of the package 32 and the material 27 for encapsulating the microelectronic device 25 of the package 32 are omitted.

The microelectronic package 32 comprises metal sheet portions 28 which are located at substantially equal levels. The microelectronic device 25 is arranged on one of the metal sheet portions 28, wherein the microelectronic device 25 is electrically connected to the other metal sheet portions 28 through the wires 11 of the lead frame element 15 which is curved such as to be capable of bridging a distance between a free side of the microelectronic device 25, i.e. another side of the device 25 than the supported side of the device 25, and the level at which the metal sheet portions 28 are located.

It is noted that the above-described microelectronic package 32 is especially suitable to be applied in a power transistor.

FIGS. 12-18 illustrate steps of a process of manufacturing a second alternative microelectronic package 33.

Figure 12:
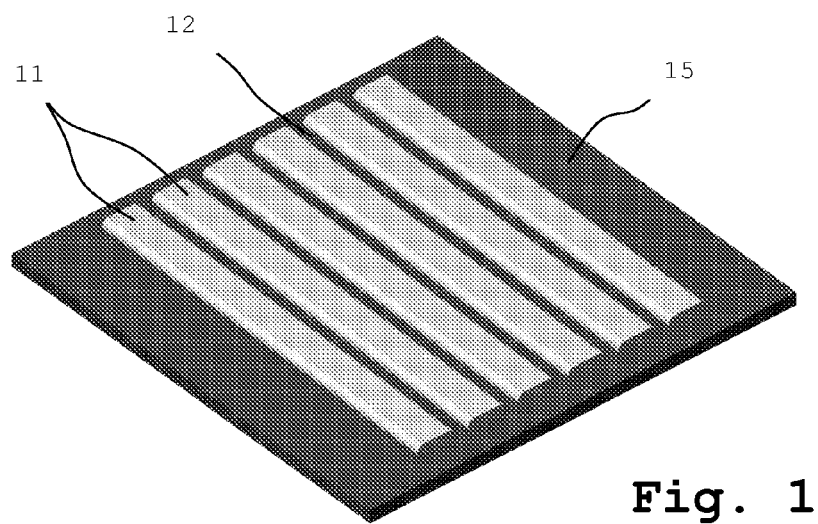
FIGS. 12-18 illustrate steps of a process of manufacturing a second alternative embodiment of a microelectronic package on the basis of a lead frame element according to the present invention.

In a first step of the manufacturing process, which is illustrated in FIG. 12, a lead frame element 15 having a number of electrically conductive narrow strips 11, which are extending in a substantially parallel configuration, and which are partially embedded in a filling material 12, is provided.

Figure 13:
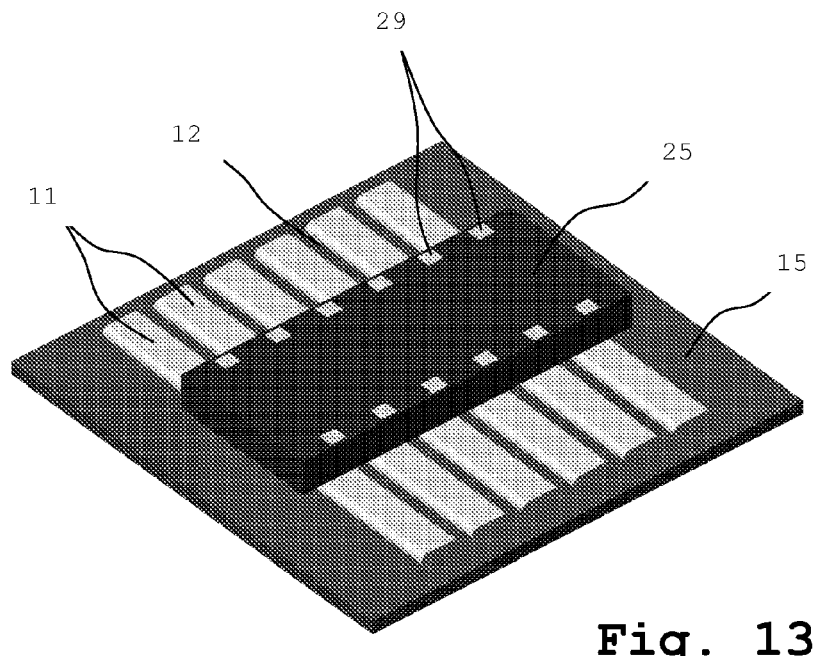

In a second step of the manufacturing process, which is illustrated in FIG. 13, a microelectronic device 25 is placed on the strips 11.

Figure 14:
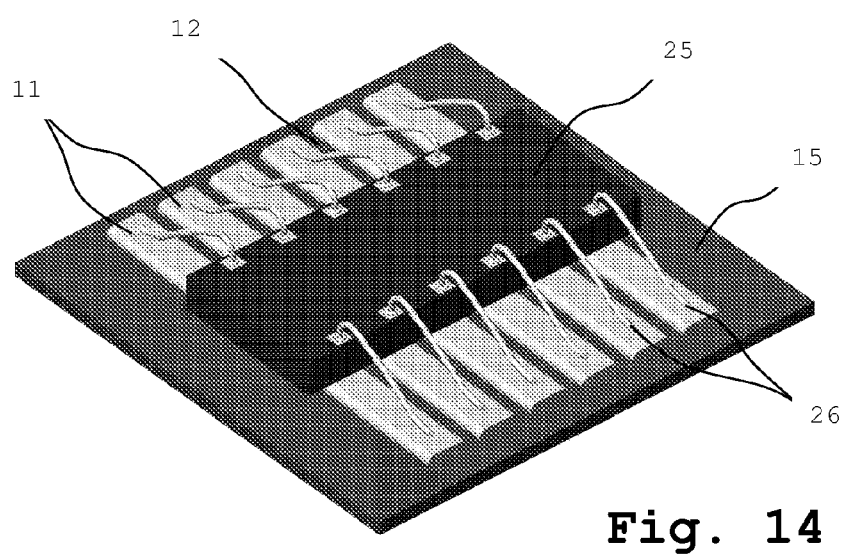

In a third step of the manufacturing process, which is illustrated in FIG. 14, electrical connections between the strips 11 and the microelectronic device 25 are established through a wirebonding process, during which wires 26 are arranged between the strips 11 and contacting areas 29 of the microelectronic device 25.

Figure 15:
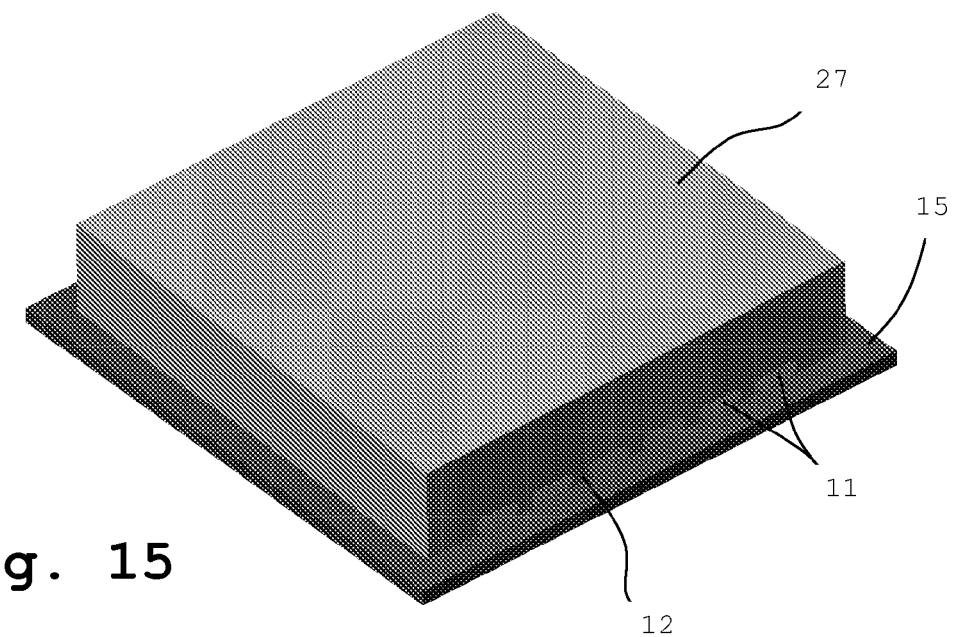
Figure 16:
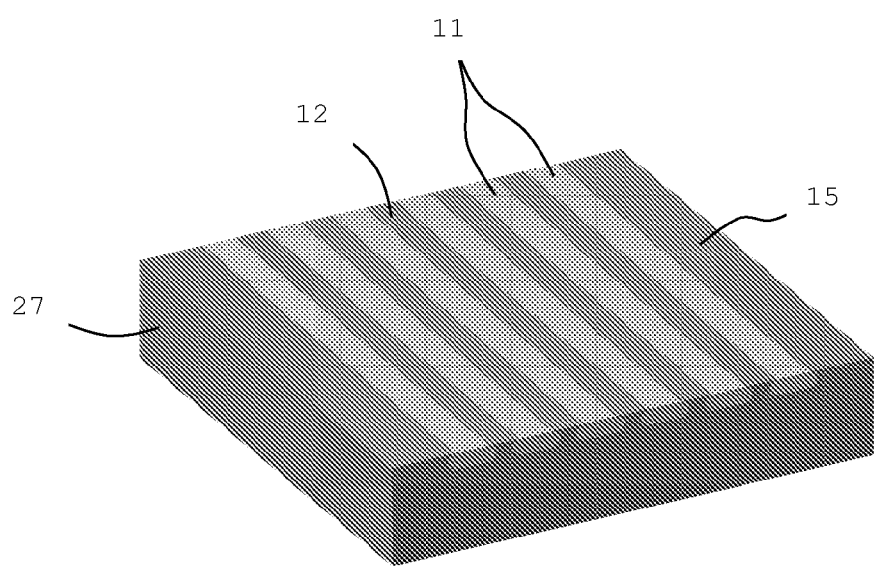

In a fourth step of the manufacturing process, the microelectronic device 25 is encapsulated in material 27, which is applied during an overmoulding process. Two views of the result of this step are shown in FIGS. 15 en 16, wherein FIG. 16 shows a side of the intermediate product where the strips 11 are present.

Figure 17:
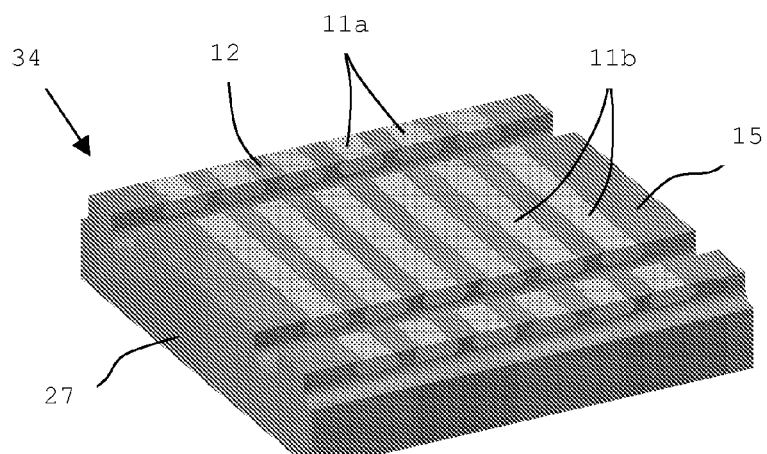

In a fifth step of the manufacturing process, which is illustrated in FIG. 17, a dicing process is performed, wherein portions of the strips 11 and filling material 12 are removed, such that end portions 11a on both ends of the strips 11 are separated from a central portion 11b of the strips 11.

In a sixth step of the manufacturing process, which is illustrated in FIG. 18, the side of the intermediate product 34 where the interrupted strips 11 are present is dipped in molten solder, such that solder bumps 16 are formed on the end portions 11a of the strips 11. At that stage, the microelectronic package 33 is ready. FIG. 19 shows a side view of a cross-section of this package 33, wherein, for sake of clarity, the material 27 for encapsulating the microelectronic device 25 is omitted. It appears from this Figure that the microelectronic device 25 is electrically connected to the end portions 11a of the strips 11, which are carrying the solder bumps 16, through the wires 26.

It is noted that the microelectronic package 33 as shown in FIGS. 18 and 19 is of the ball grid array type, on the basis of the presence of the solder bumps 35. In fact, the intermediate product 34 as shown in FIG. 17, which does not yet comprise the solder bumps 35, may also be regarded as an example of an embodiment of a microelectronic package, in particular a microelectronic package 34 of the land grid array type.

It will be clear to a person skilled in the art that the scope of the present invention is not limited to the examples discussed in the foregoing, but that several amendments and modifications thereof are possible without deviating from the scope of the present invention as defined in the attached claims. While the present invention has been illustrated and described in detail in the Figures and the description, such an illustration and description are to be considered illustrative or exemplary only, and not restrictive. The present invention is not limited to the disclosed embodiments.

It is noted that a major function of the lead frame element 15 according to the present invention, which comprises a number of electrically conductive wires, strips or other elongated members 11, wherein these members 11 are partially embedded in a filling material 12, is enabling electric contact to a microelectronic device 25 from outside of a microelectronic package 31, 32, 33, 34 of which both the lead frame element 15 and the microelectronic device 25 are part. Another function of the lead frame element 15, in particular the filling material 12 of the lead frame element 15, may be contributing to a required stiffness of the microelectronic package 31, 32, 33, 34.

Variations to the disclosed embodiments can be understood and effected by a person skilled in the art in practicing the claimed invention, from a study of the Figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope of the present invention.

In the foregoing, a microelectronic package 31, 32, 33, 34 having a microelectronic device 25, which is encapsulated in a quantity of material 27, and a lead frame element 15 for enabling the microelectronic device 25 to be electrically contacted from outside of the package 31, 32, 33, 34 has been described. The lead frame element 15 comprises at least two elongated members 11 comprising electrically conductive material and a filling material 12 comprising electrically insulating material, wherein the members 11 are partially embedded in the filling material 12. In particular, portions of the members 11 are exposed on two sides of the lead frame element 15, wherein the microelectronic device 25 is electrically connected to the portions which are exposed at the side of the lead frame element 15 where the device 25 is located.

The lead frame element 15 is manufactured by providing elongated members 11, positioning the members 11 according to a predetermined configuration, providing filling material 12 to spaces 13 which are present between the members 11, and possibly removing portions of the filling material 12 and the members 11 in order to expose the electrically conductive material of the members 11. In a preferred way of manufacturing an array of lead frame elements 15, a foil 10 comprising wires 11 and filling material 12 is manufactured by winding wires 11 around a winding reel 20, and subsequently supplying the filling material 12 to spaces 13 between the wires 11 while the reel 20 is being rotated.

An important advantage of manufacturing the lead frame element 15 on the basis of elongated members 11 and a filling material 12 is that no waste or only a small quantity of waste is produced.

The invention claimed is:

1. Method for manufacturing an element which is intended to be applied in a microelectronic package having at least one microelectronic device, for the purpose of enabling the microelectronic device to be electrically contacted from outside of the package, comprising the following steps:
    providing at least two members comprising electrically conductive material and having an elongated appearance;
    placing the elongated members in predetermined positions with respect to each other; and
    embedding at least a portion of the elongated members in a non-conductive filling material and fixing the elongated members in their predetermined positions with respect to each other; and
    after providing the at least two elongated members and after embedding at least the portion of the elongated members in the non-conductive filling material, electrically connecting the at least one microelectronic device to the at least two elongated members.

2. Method according to claim 1, further comprising the step of removing a portion of the filling material in order to expose a portion of the elongated members.

3. Method according to claim 1 further comprising temporarily supporting the elongated members and ensuring that the elongated members maintain their predetermined positions with respect to each other when the filling material is provided.

4. Method according to claim 1, wherein the elongated members are positioned at different levels, in a crossed configuration.

5. Method according to claim 1, wherein the elongated members are interconnected in a first instance, and wherein the elongated members are separated after the step of providing the filling material has been carried out.

6. Method according to claim 1, wherein, after the step of providing the filling material has been carried out, at least one of the elongated members is interrupted by cutting away a portion of the elongated member.

7. Method according to claim 2, wherein a layer of the element is removed by cutting through the filling material and the elongated members, wherein a portion of the elongated members extending in a longitudinal direction of the elongated members is removed.

8. Method for manufacturing a foil which is intended to be applied in a process of manufacturing an array of elements, wherein each element is intended to be applied in a microelectronic package having at least one microelectronic device, for the purpose of enabling the microelectronic device to be electrically contacted from outside of the package, comprising the following steps:
    providing at least one member comprising electrically conductive material and having an elongated appearance;
    providing a winding reel and winding the elongated member around the reel;
    embedding the elongated member wound around the reel in a non-conductive filling material;
    removing a portion of the filling material in order to expose a portion of the elongated members; and
    removing a layer of the element by cutting through the filling material and the elongated members, wherein a portion of the elongated members extending in a longitudinal direction of the elongated members is removed.

9. Method for manufacturing a microelectronic package, comprising the following steps:
    providing an element having at least two elongated members comprising electrically conductive material, which are at least partially embedded in a non-conductive filling material;
    providing a microelectronic device and establishing electrical connections between this device and at least two elongated members of the element; and
    encapsulating the microelectronic device in an encapsulation material;
    removing a portion of the non-conductive filling material in order to expose a portion of the elongated members; and
    removing a layer of the element by cutting through the non-conductive filling material and the elongated members, wherein a portion of the elongated members extending in a longitudinal direction of the elongated members is removed.

10. Method for manufacturing a microelectronic package, comprising the following steps:
    manufacturing an array of microelectronic packages by providing an array of elements, wherein each element has at least two elongated members comprising electrically conductive material, which are at least partially embedded in a non-conductive filling material;

after providing the array of elements, providing microelectronic devices and establishing electrical connections between these devices and at least two elongated members of the elements;

providing material for encapsulating the microelectronic devices; and dividing the array of microelectronic packages into individual microelectronic packages.

11. Method for manufacturing a microelectronic package, comprising the following steps:

manufacturing an array of microelectronic packages by providing a foil comprising non-conductive material in which elongated members comprising electrically conductive material are at least partially embedded;

after providing the foil, providing microelectronic devices and establishing electrical connections between these devices and at least two elongated members of the foil;

providing material for encapsulating the microelectronic devices; and dividing the array of microelectronic packages into individual microelectronic packages.

12. Method according to claim 11, comprising the step of folding the foil.

13. Method for manufacturing an element which is intended to be applied in a microelectronic package having at least one microelectronic device, for the purpose of enabling the microelectronic device to be electrically contacted from outside of the package, comprising the following steps:

providing at least two members comprising electrically conductive material and having an elongated appearance;

placing the elongated members in predetermined positions with respect to each other;

providing a non-conductive filling material for embedding at least a portion of the elongated members and fixing the elongated members in their predetermined positions with respect to each other; and removing a portion of the filling material in order to expose a portion of the elongated members;

wherein a layer of the element is removed by cutting through the filling material and the elongated members, wherein a portion of the elongated members extending in a longitudinal direction of the elongated members is removed.

* * * * *